United States Patent
Choi

(10) Patent No.: US 8,730,712 B2
(45) Date of Patent: May 20, 2014

(54) SRAM INCLUDING WRITE ASSIST CIRCUIT AND METHOD OF OPERATING SAME

(75) Inventor: Jae Seung Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 187 days.

(21) Appl. No.: 13/337,761

(22) Filed: Dec. 27, 2011

(65) Prior Publication Data

US 2012/0170388 A1    Jul. 5, 2012

(30) Foreign Application Priority Data

Dec. 29, 2010    (KR) .................... 10-2010-0137975

(51) Int. Cl.
*G11C 11/00* (2006.01)

(52) U.S. Cl.
USPC .............. 365/154; 365/189.09; 365/189.16; 365/203

(58) Field of Classification Search
USPC ................ 365/154, 189.09, 189.16, 203
See application file for complete search history.

(56) References Cited

U.S. PATENT DOCUMENTS

| | | | |
|---|---|---|---|
| 6,067,264 A | 5/2000 | Kwon | |
| 6,711,051 B1 * | 3/2004 | Poplevine et al. | 365/154 |
| 7,092,279 B1 * | 8/2006 | Sheppard | 365/154 |
| 7,379,354 B2 * | 5/2008 | Heinrich-Barna et al. | 365/189.16 |
| 7,499,347 B2 * | 3/2009 | Chen et al. | 365/194 |
| 7,505,339 B2 | 3/2009 | Ohbayashi | |
| 7,733,686 B2 * | 6/2010 | Clinton | 365/154 |
| 8,018,788 B2 * | 9/2011 | Jung et al. | 365/226 |
| 2007/0263447 A1 | 11/2007 | Koike et al. | |

FOREIGN PATENT DOCUMENTS

| | | |
|---|---|---|
| JP | 2006-351051 | 12/2006 |
| JP | 2007-328900 | 12/2007 |
| KR | 100268430 B1 | 7/2000 |

* cited by examiner

*Primary Examiner* — Pho M Luu
(74) *Attorney, Agent, or Firm* — Volentine & Whitt, PLLC

(57) ABSTRACT

A static random access memory (SRAM) is described and includes; a bit cell connected with a word line, connected between a bit line and a complementary bit line, and receiving an internal voltage from a write assist circuit. The write assist circuit includes a power control circuit that charges/discharges an internal voltage line to provide the internal voltage in response to at least one control signal, and a compensation circuit that controls a level of the internal voltage.

17 Claims, 7 Drawing Sheets

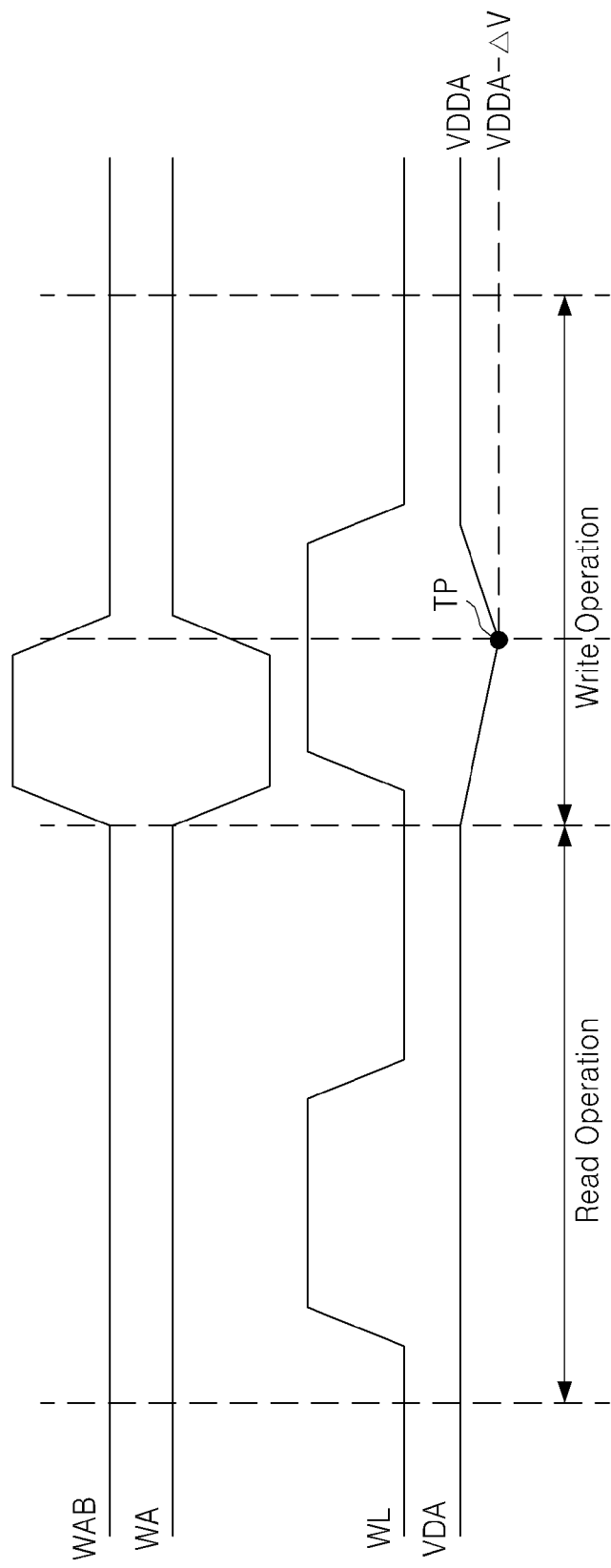

SRAM INCLUDING WRITE ASSIST CIRCUIT AND METHOD OF OPERATING SAME

CROSS-REFERENCE TO RELATED APPLICATIONS

This application claims priority under 35 U.S.C. §119(a) from Korean Patent Application No. 10-2010-0137975 filed Dec. 29, 2010, the subject matter of which is hereby incorporated by reference.

BACKGROUND OF THE INVENTION

The present inventive concept relates to static random access memory (SRAM) devices. More particularly, the inventive concept relates to SRAM devices including a write assist circuit and methods of operating same.

Contemporary data processing and consumer electronic devices increasing demand semiconductor memory devices and memory systems capable of operating a high speed. Memory devices and memory systems perform different operations (e.g., read operations, write operations and erase operations) to store data, retrieve stored data, and maintain or manage stored data. Each of these operations requires a certain amount of execution time or "cycle time" to be performed within the memory device or memory system. However, the write operation cycle time (i.e., a period of time required to perform a write operation) that most directly affects or determines the maximum speed at which a memory device or memory system may operate.

Despite the limiting nature of the write operation cycle time, it is critical that input data being written to constituent memory cells (or bit cells) be presented to the memory cells under conditions that ensure proper execution of write operation. For example, the input data must be stably provided during an appropriate timing window and must be presented at discernible voltage levels. As a result, certain contemporary memory devices use a so-called "write assist" techniques to better facilitate the execution of write operations. The write assist functionality is typically provided by a write assist circuit associated with one or more memory cells in an array of memory cells.

Unfortunately, while the use of a write assist circuit better facilitates the accuracy of data outcomes during write operations, it does so at the cost of speed. Plainly stated, the conventional incorporation of write assist circuitry within a memory device tends to further limit the maximum speed at which the memory device may be effectively operated.

SUMMARY OF THE INVENTION

Certain embodiments of the present inventive concept provide static random access memory (SRAM) devices that functionally incorporate write assist circuitry, yet are capable of operating at high speed. Other embodiments of the inventive concept provide methods of operating SRAM devices that functionally incorporate write assist circuitry at relatively high speed.

In one embodiment, the inventive concept provides a static random access memory (SRAM) device including; a bit cell connected with a word line, connected between a bit line and a complementary bit line, and receiving an internal voltage from a write assist circuit, wherein the write assist circuit comprises; a power control circuit that charges/discharges an internal voltage line to provide the internal voltage in response to at least one control signal, and a compensation circuit that controls a level of the internal voltage.

In another embodiment, the inventive concept provides an electronic system includes; a memory, and a memory controller configured to control operation of the memory, wherein the memory controller comprises a static random access memory (SRAM). The SRAM includes a bit cell connected with a word line, connected between a bit line and a complementary bit line, and receiving an internal voltage from a write assist circuit, wherein the write assist circuit comprises; a power control circuit that charges/discharges an internal voltage line to provide the internal voltage in response to at least one control signal, and a compensation circuit that controls a level of the internal voltage.

In another embodiment, the inventive concept provides a method of operating a static random access memory (SRAM) device that includes a bit cell connected with a word line and connected between a bit line and a complementary bit line. The method includes; during a write operation directed to the bit cell, enabling the word line, after enabling the word line, decreasing an internal voltage applied to the bit cell by a write assist circuit in response at least one control signal, and after decreasing the internal voltage, increasing the internal voltage in response to the at least one control signals.

In another embodiment, the inventive concept provides a method of operating a static random access memory (SRAM) device during a write operation, wherein the SRAM comprises a bit cell connected with a word line, connected between a bit line and a complementary bit line, and receiving an internal voltage provided by a write assist circuit. The method includes; enabling the word line during a word line enabled window, and activating a control signal applied to the write assist circuit to decrease the internal voltage, and then inactivating the control signal to increase the internal voltage.

BRIEF DESCRIPTION OF THE DRAWINGS

The above and other features and advantages of the present inventive concept will become more apparent by describing in detail exemplary embodiments thereof with reference to the attached drawings in which:

FIG. 4A is a waveform diagram illustrating one possible set of timing relationships for control signals associated with the write assist circuit of FIGS. 1 and 2;

DETAILED DESCRIPTION

Embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
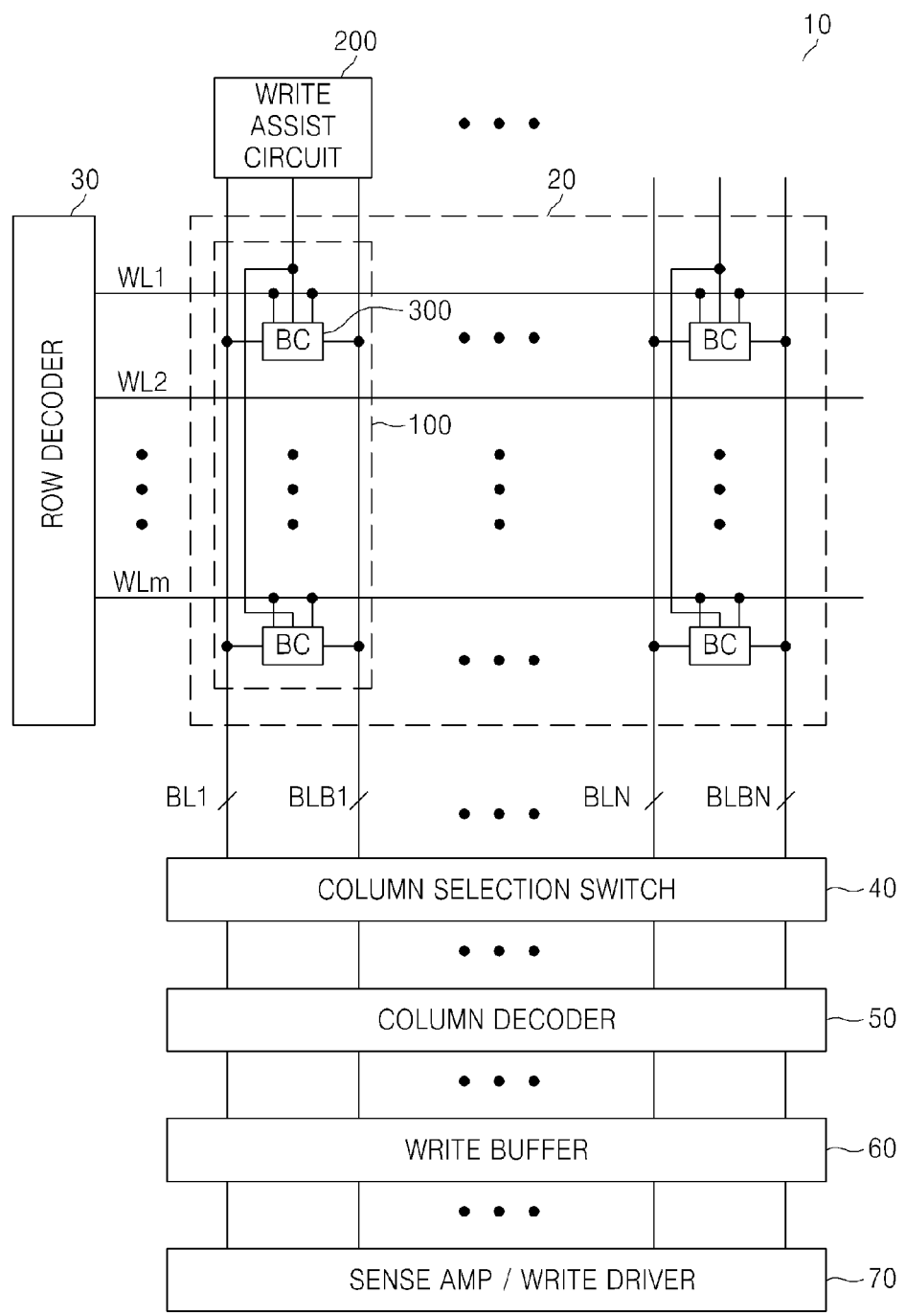
FIG. 1 is a block diagram of a static random access memory (SRAM) according to an embodiment of the inventive concept.

Figure (FIG.) 1 is a block diagram illustrating in relevant portion a static random access memory (SRAM) device according to an embodiment of the inventive concept. The SRAM device 10 of FIG. 1 comprises a plurality of word lines WL1, WL2, . . . , WLM, and a plurality of bit line pairs BL1 and BLB1, . . . , BLN and BLBN arranged in a matrix to form a bit cell array 20, a row decoder 30, a column selection switch 40, a column decoder 50, a write buffer 60, a sense amplifier/write driver 70, and a plurality of write assist circuits 200.

The plurality of bit line pairs BL1 and BLB1 through BLN and BLBN is arranged to cross the plurality of word lines WL1 through WLM in the bit cell array 20, and includes bit lines BL1, BL2, . . . , BLN respectively paired with a corresponding "bar" (or complementary) bit lines BLB1, BLB2, . . . , BLBN.

The row decoder 30 may be used to select one or more word line(s) among the plurality of word lines WL1 through WLM in response to an externally provided row address.

The column decoder 50 may be used to generate and output a column selection signal that selects one bit line pair among the plurality of bit line pairs BL1 and BLB1 through BLN and BLBN through the column selection switch 40 in response to an externally provided column address. Within this configuration, the column selection switch 40 selects one bit line pair among the bit line pairs BL1 and BLB1 through BLN and BLBN in response to the column selection signal, and may include a plurality of transistors.

The write buffer 60 may be used to receive input data provided by an external device and write the input data to a selected bit cell during a write operation.

During a read operation directed to a selected bit cell, the sense amplifier/write driver 70 may be used to amplify a voltage difference between a bit line and a complementary bit line that are connected with the selected bit cell in order to generate output data.

The bit cell array 20 includes a plurality of bit cells 300. Each of the bit cells 300 is connected to one of the plurality of word lines WL1 through WLM and between one of the plurality of bit lines BL1 through BLN and its corresponding complementary bit line BLB1 through BLBN. Each bit cell may be used to store data written thereto during a write operation.

The SRAM device 10 further comprises one or more write assist circuit(s) 200. In the embodiment shown in FIG. 1, one write assist circuit 200 is associated with a bit cell 300 disposed in a single column 100. In this context, the term "column" refers to an arrangement of one bit line pair (e.g., BL1 and BLB1) as it traverses at least a portion of the bit cell array 20 across one or more word lines.

The write assist circuit 200 may be used to apply a "write assist voltage" to a selected bit cell in response to a write assist control signal. This control signal may take one of many different forms and may arise in the operation of the SRAM 10 under a number of different conditions. For example, the write assist control signal may include a write assist signal, a sleep mode signal, a power down signal, etc. One possible embodiment of the write assist circuit 200 will be described in some additional detail with reference to FIG. 2.

Figure 2:
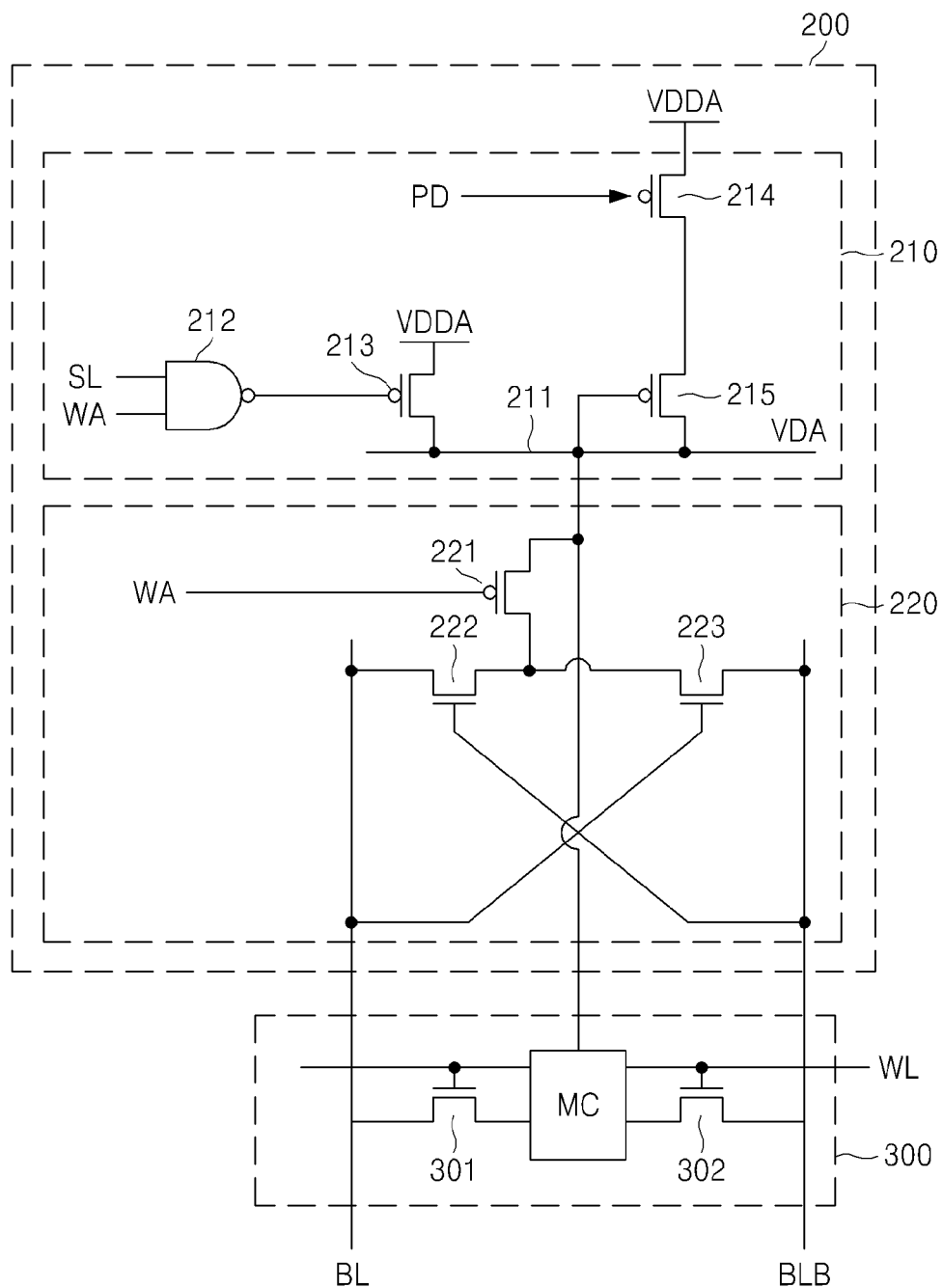
FIG. 2 is a circuit diagram further illustrating in one possible embodiment the write assist circuit of FIG. 1.
Figure 3:
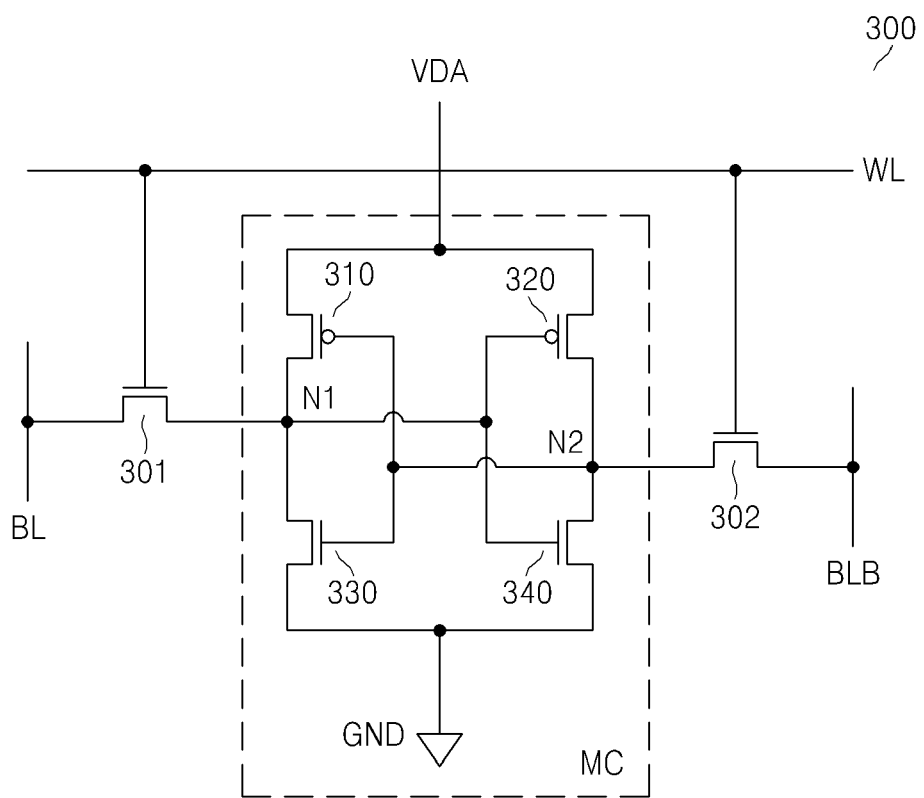
FIG. 3 is a circuit diagram further illustrating in one possible embodiment the bit cell of FIG. 2.

FIG. 2 is a circuit diagram further illustrating the write assist circuit 200 of FIG. 1 according to an embodiment of the inventive concept. FIG. 3 is a circuit diagram further illustrating the bit cell 300 of FIGS. 1 and 2 according to an embodiments of the inventive concept. Referring to FIG. 2, the write assist circuit 200 may generally comprise a power control circuit 210 and a compensation circuit 220, and is connected to the bit cell 300, as well as a pair of bit lines (BL/BLB) connected to the bit cell 300.

The power control circuit 210 is connected between a power supply voltage (e.g., VDDA) and an internal voltage line 211 in such a manner that it selectively enables or disables (hereafter denoted by the term "enables/disables") the application of the write assist voltage to the bit cell 300 in response to, for example, a power down signal PD, a write assist signal WA, and/or a sleep mode signal SL.

The compensation circuit 220 is configured to control the level of the write assist voltage provided by the power control circuit 210 to the bit cell 300. For example, the compensation circuit 220 may reduce (or "bring down") the level of an internal voltage VDA apparent on the internal voltage line 211. The operation of the compensation circuit 220 will be described in some additional detail with reference to FIG. 3.

With reference to the exemplary circuit of FIG. 2, the power control circuit 210 comprises a NAND gate 212, a first P-type metal oxide semiconductor (PMOS) transistor 213, a second PMOS transistor 214, and a third PMOS transistor 215. The compensation circuit 220 comprises a fourth PMOS transistor 221, a first N-type metal oxide semiconductor (NMOS) transistor 222, and a second NMOS transistor 223.

The NAND gate 212 receives the write assist signal WA and the sleep mode signal SL. The first PMOS transistor 213 has a source terminal connected with the power supply voltage VDDA, a drain connected with the internal voltage line 211, and a gate that receives an output from the NAND gate 212. The source of the second PMOS transistor 214 is connected with the power supply voltage VDDA, and the power down signal PD is applied to a gate of the second PMOS transistor 214. The source of the third PMOS transistor 215 is connected with the drain of the second PMOS transistor 214, and the gate and drain of the third PMOS transistor 215 are connected with the internal voltage line 211.

When the power down signal PD is active (e.g., is logically "high") and the sleep mode signal SL is inactive (e.g., is logically "low"), the first and second PMOS transistors 213 and 214 are turned OFF regardless of active/inactive state of the write assist signal WA, thereby disabling the application of the write assist voltage to the bit cell 300.

However, when the power down signal PD is inactive, the second PMOS transistor 214 is turned ON. When the sleep mode signal SL is active and the write assist signal WA is inactive (e.g., is logically "high"), the first PMOS transistor 213 is turned ON. Under these conditions, the internal voltage VDA apparent on the internal voltage line 211 becomes (e.g., rises to be) equal to the power supply voltage VDDA, in effect applying the power supply voltage VDDA to the bit cell 300 as the write assist voltage.

When the power down signal PD and the sleep mode signal SL are both inactive, regardless of the active/inactive states of the write assist signal WA the first PMOS transistor 213 is turned OFF, the second PMOS transistor 214 is turned ON, and the gate and the drain of the third PMOS transistor 215 are connected with each other so that the third PMOS transistor 215 operates as a diode. Under these conditions, the internal voltage VDA apparent on the internal voltage line 211 floats and the floating voltage is applied to the bit cell 300 as the write assist voltage.

In the embodiment of FIG. 2, the bit cell 300 comprises a memory cell MC respectively connected between a bit line BL and a complementary bit line BLB by a third NMOS transistor 301 and a fourth NMOS transistor 302.

The compensation circuit 220 is connected with the internal voltage line 211. The compensation circuit 220 includes the fourth PMOS transistor 221, the first NMOS transistor 222, and the second NMOS transistor 223 and controls the level of the write assist voltage applied to the bit cell 300 by the power control circuit 210.

The source of the fourth PMOS transistor 221 is connected with the internal voltage line 211, the write assist signal WA is applied to the gate of the fourth PMOS transistor 221, and the drain of the fourth PMOS transistor 221 is connected with a voltage terminal between the first and second NMOS transistors 222 and 223.

The first NMOS transistor 222 is thus source/drain connected between the bit line (BL) and the voltage terminal, and its gate is connected to the complementary bit line BLB. Similarly, the second NMOS transistor 223 is source/drain connected between the complementary bit line BLB and the voltage terminal, and its gate is connected to the bit line BL.

Referring to FIG. 3, in one possible embodiment, the bit cell 300 is connected with a word line WL and between a pair of bit lines BL/BLB running perpendicular to the word line WL. As noted above, the bit cell 300 includes a bit cell MC connected between the pair the bit lines BL/BLB by the NMOS transistor 301 and the fourth NMOS transistor 302.

The third NMOS transistor 301 has a gate connected with the word line WL and a first terminal connected with the bit line BL. The fourth NMOS transistor 302 has a gate connected with the word line WL and a first terminal connected with the complementary bit line BLB.

The MC is connected between a second terminal of the third NMOS transistor 301 and a second terminal of the fourth NMOS transistor 302 and stores cell data.

The MC includes a fifth PMOS transistor 310, a sixth PMOS transistor 320, a fifth NMOS transistor 330, and a sixth NMOS transistor 340.

A first terminal of the fifth PMOS transistor 310 is connected with the internal voltage line 211. A first terminal of the fifth NMOS transistor 330 is connected with a second terminal of the fifth PMOS transistor 310 and the second terminal of the third NMOS transistor 301. A second terminal of the fifth NMOS transistor 330 is connected to ground GND. A gate of the fifth NMOS transistor 330 is connected with a gate of the fifth PMOS transistor 310 and the second terminal of the fourth NMOS transistor 302.

A first terminal of the sixth PMOS transistor 320 is connected with the internal voltage line 211.

A first terminal of the sixth NMOS transistor 340 is connected with a second terminal of the sixth PMOS transistor 320 and the second terminal of the fourth NMOS transistor 302. A second terminal of the sixth NMOS transistor 340 is connected to ground GND. A gate of the sixth NMOS transistor 340 is connected with a gate of the sixth PMOS transistor 320 and the second terminal of the third NMOS transistor 301. The bit cell 300 stores cell data at a first node N1 and stores complementary cell data (data opposite to the cell data stored in the first node N1) at a second node N2.

The bit line pair BL/BLB is connected with the sense amplifier/write driver 70. Ground voltage GND is applied to the bit line BL and a predetermined voltage (e.g., VDD) is applied to the complementary bit line BLB by operation of the sense amplifier/write driver 70.

In order to facilitate a write operation directed to the bit cell 300, the drivability of the third NMOS transistor 301 should be greater than the drivability of the fifth PMOS transistor 310 by at least a predetermined ratio (i.e., a gamma ratio) of about 3, for example. To satisfy this condition, the drivability of the fifth PMOS transistor 310 may be relatively decreased.

Referring to FIGS. 2 and 3, when the ground voltage GND is applied to the bit line BL, the second NMOS transistor 223 is turned OFF and the predetermined voltage (e.g., VDD) is applied to the complementary bit line BLB. As a result, the first NMOS transistor 222 is turned ON.

During a write operation, that is, when the power down signal PD, the sleep mode signal SL are all inactive (i.e., are logically low), and the write assist signal WA are is active (i.e., are logically low), the fourth PMOS transistor 221 is turned ON, which may be a moment before the word line WL is enabled.

Since the second NMOS transistor 223 is turned OFF and the first NMOS transistor 222 is turned ON, the internal voltage VDA apparent on the internal voltage line 211 diode-connected with the power supply voltage VDDA rapidly drops as the result of a current path formed by the fourth PMOS transistor 221 and the first NMOS transistor 222. Consequently, when the write assist circuit 200 is used, the drivability of the fifth PMOS transistor 310 is rapidly decreased, thereby facilitating the write operation.

In addition, after the transition of the first node N1 and the second node N2, the internal voltage VDA of apparent on the internal voltage line 211 is charged by the level of the power supply voltage VDDA while the word line WL is enabled, so that the drivability of the fifth PMOS transistor 310 is restored and the voltage apparent at the first or second node N1 or N2 is rapidly restored to a level equal to that of the power supply voltage VDDA. This operation will be described in some additional detail with reference to FIGS. 4A and 4B later.

Accordingly, the write assist circuit 200 is capable of operating at relatively high speeds and may thus be effectively used in high-speed memories.

The ground voltage GND is applied to the bit line BL and the predetermined voltage (e.g., VDD) is applied to the complementary bit line BLB in embodiments such as the one illustrated in FIG. 3, but the scope of the inventive concept is not limited to only this operating scheme. Other embodiments of the inventive concept may use different operating schemes. for example, the predetermined voltage may be applied to the bit line BL and the ground voltage GND may be applied to the complementary bit line BLB in other embodiments in which an operation is opposite to the above-described operation.

Figure 4B:
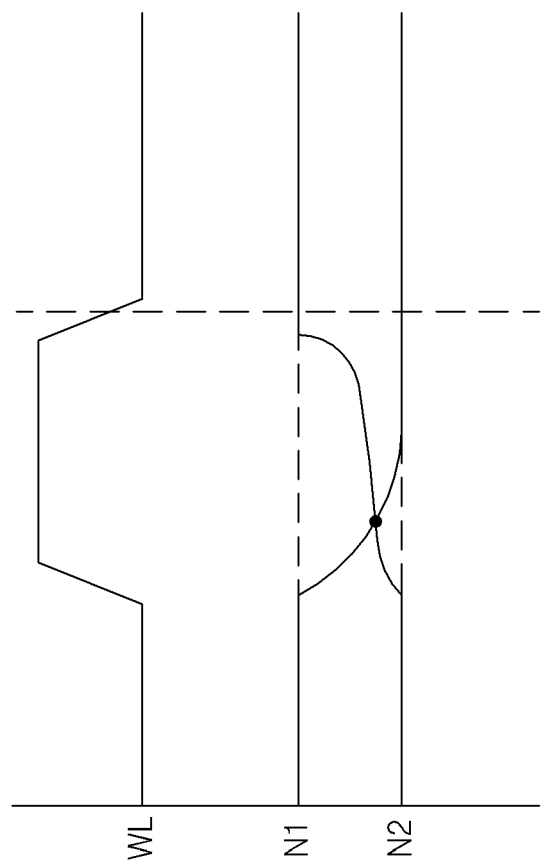
FIG. 4B is a waveform diagram further illustrating a voltage transition between a first node and a second node of the bit cell of FIG. 3.

FIG. 4A is a waveform diagram illustrating one possible method of operation for the write assist circuit 200 of FIG. 2. FIG. 4B is a waveform diagram further illustrating a voltage transition between the first node N1 and the second node N2 in the bit cell 300 of FIG. 3.

Referring collectively to FIGS. 2, 3, 4A and 4B, during a write operation, the write assist signal WA applied to the NAND gate 212 and the fourth PMOS transistor 221 is assumed to be active (e.g., is logically low) while a complementary write assist signal WAB is assumed to be inactive (e.g., is logically high). Under these conditions, the internal voltage VDA apparent on the internal voltage line 211 drops from the level of the power supply voltage VDDA to a predetermined level (e.g., VDDA-ΔV). Due to the effects of the compensation circuit 220, the internal voltage VDA drops quickly to a trip point TP.

So long as the word line WL is enabled, the internal voltage VDA is charged to the level of the power supply voltage VDDA, such that the drivability of the fifth PMOS transistor 310 is restored.

When the internal voltage VDA drops from the level of the power supply voltage VDDA to the predetermined level (e.g., VDDA-ΔV) and is then charged back to the level of the power supply voltage VDDA while the word line WL is enabled, the voltage apparent at the second node N2 is rapidly restored to the level of the power supply voltage VDDA, as illustrated in FIG. 4B. In other words, the internal voltage VDA may be charged to the level of the power supply voltage VDDA by controlling the power down signal PD, the sleep mode signal SL, and the write assist signal WA which are provided to the power control circuit 210.

Therefore, according to certain embodiments of the inventive concept, the inadvertent write-back of data may be prevented and a rapid turn OFF of the word line WL is accomplished, such that the write assist circuit 200 may be used even in relatively high-speed memories.

In contrast, if the internal voltage VDA is not charged to the level of the power supply voltage VDDA while the word line WL is enabled, the voltage apparent at the second node N2 is not quickly restored within the enabled window of the word line WL. Since the voltage apparent at the second node N2 does not have an appropriate level, e.g., the level of the power supply voltage VDDA, the write assist circuit 200 cannot be readily used in high-speed memories.

Figure 5:
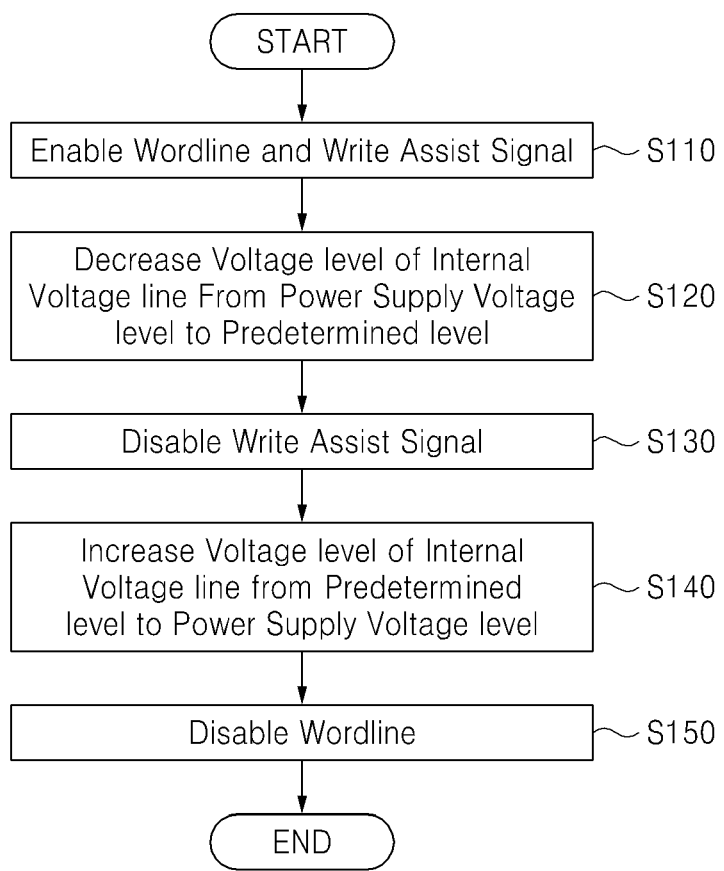
FIG. 5 is a flowchart summarizing one possible method of operating a SRAM device according to certain embodiments of the inventive concept.

FIG. 5 is a flowchart summarizing a method of operating a SRAM device according to certain embodiments of the inventive concept. Referring to FIGS. 1 through 5, during a write operation directed to a selected bit cell, the word line and the write assist signal are enabled (S110). In certain embodiments of the inventive concept, the word line and the write assist signal may be enabled during at least partially overlapping "enabled windows" (i.e., respective periods of time during which the word line is enabled by an applied voltage and the write assist signal is active). The respective enabled windows for the word line and the write assist signal need not be fully overlapping. For example, the word line may be enabled before the write assist signal is active, or the write assist signal may be active before the word line is enabled. However, when the word line is enabled, the write assist circuit may cause a decrease in the level of the internal voltage VDA down from the power supply voltage level VDDA to the predetermined level (e.g., VDDA-ΔV) (S120).

Then, the write assist signal is disabled (e.g., transitions to an inactive state) (S130). As a result, the write assist circuit increases the level of the internal voltage VDA from the predetermined level (e.g., VDDA-ΔV) back up to the power supply voltage level VDDA (S140).

Following restoration of the internal voltage VDA, wholly or in substantial part, to the level of the power supply voltage, the word line may be disabled (S150).

According to the foregoing method, the level of the internal voltage VDA provided to the bit cell 300 by the write assist circuit may be time-wise altered in response to at least one control signal (e.g., the write assist signal WA). That is, the internal voltage VDA apparent on the internal voltage line 211 of the write assist circuit 200 may be charged and discharged (hereafter, collectively and selectively indicated as a functional "charge/discharge" capability) by the power control circuit 210 in response to at least one control signal (e.g., a power down signal PD, sleep mode signal SL, and/or write assist signal WA).

Figure 6:
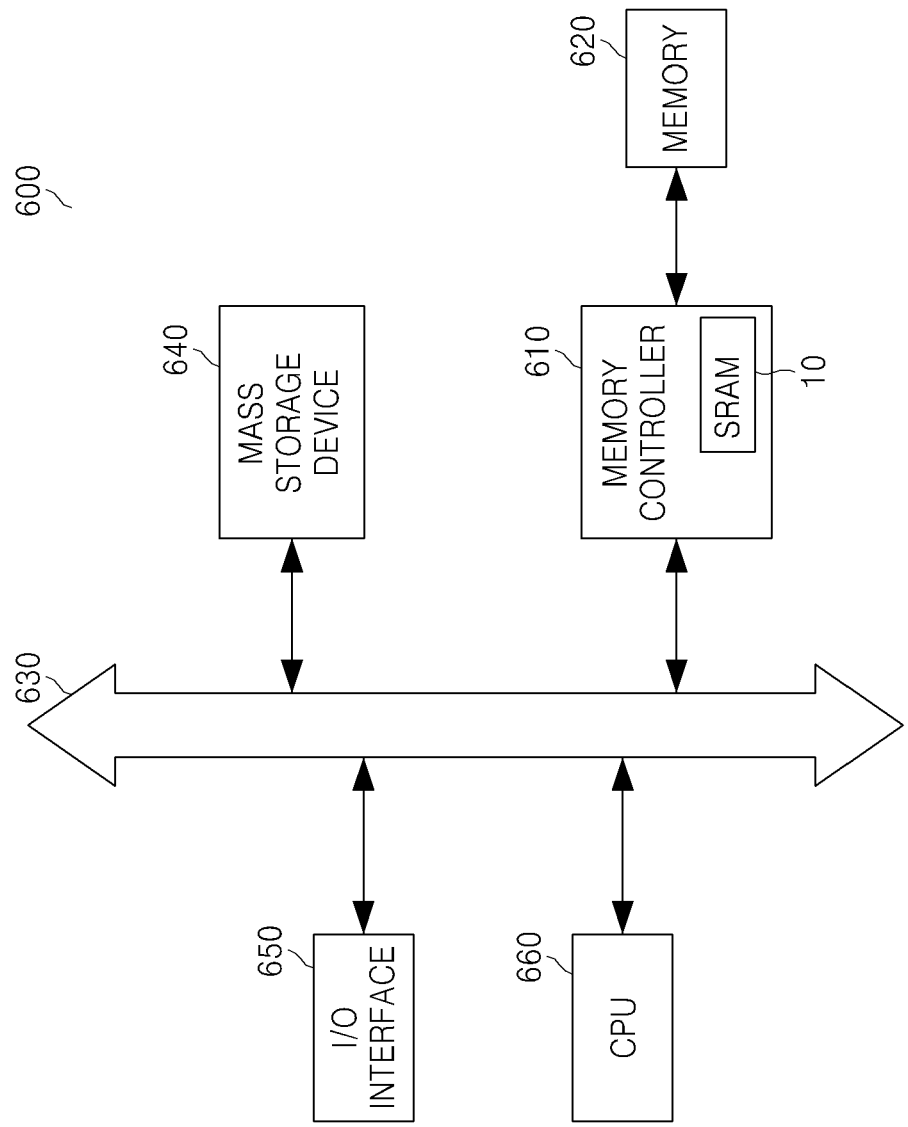
FIG. 6 is a general block diagram of an electronic system according to an embodiment of the inventive concept.

FIG. 6 is a block diagram of an electronic system 600 according to certain embodiments of the inventive concept. Referring to FIG. 6, the electronic system 600 comprises a memory controller 610, a memory 620, a mass storage device 640, an input/output (I/O) interface 650, and a central processing unit (CPU) 660, which are connected with one another through a system bus 630. The memory controller 610 may include an SRAM device such as the SRAM device 10 of FIG. 1.

The memory 620 includes flash memory, phase-change RAM (PRAM), and magnetic RAM (MRAM). The mass storage device 640 includes a solid state drive (SSD), a hard disk drive (HDD), and a network-attached storage (NAS).

The I/O interface 650 may be connected with a network port that can be connected to a network or may be directly connected with the network.

While the electronic system 600 operates, the CPU 660 may control the memory controller 610 and the memory 620. The memory controller 610 controls the memory 620.

Particular components of the electronic system 600 may be changed. For instance, the CPU 660 may be any one of various types of CPUs and the memory 620 may be any one of various types of memory.

The electronic system 600 is not restricted to the embodiments illustrated in FIG. 5 and may further include other components. The electronic system 600 illustrated in FIG. 5 is just an example of an electronic system including the SRAM device 10. The SRAM device 10 may be used in any electronic systems requiring SRAM.

According to embodiments of the inventive concept, an SRAM device may readily be used in conjunction with a write assist circuit during a write operation while maintaining the capability of operating at relatively high speed.

While the present inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A static random access memory (SRAM) device comprising:
   a bit cell connected with a word line, connected between a bit line and a complementary bit line, and receiving an internal voltage from a write assist circuit,
   wherein the write assist circuit comprises; a power control circuit that charges/discharges an internal voltage line to provide the internal voltage in response to at least one control signal, and a compensation circuit that controls a level of the internal voltage,
   the compensation circuit comprising:
      a P-type metal oxide semiconductor (PMOS) transistor having a first terminal connected with the internal voltage line;
      a first N-type metal oxide semiconductor (NMOS) transistor having a first terminal connected with a second terminal of the PMOS transistor, a second terminal connected with a bit line, and a gate connected with the complementary bit line; and
      a second NMOS transistor having a first terminal connected with the second terminal of the PMOS transistor, a second terminal connected with the complementary line, and a gate connected with the bit line.

2. The SRAM device of claim 1, wherein the at least one control signal includes a power down signal, a write assist signal, and a sleep mode signal.

3. The SRAM device of claim 2, wherein the write assist signal is applied to a gate of the PMOS transistor.

4. The SRAM device of claim 3, wherein a write operation directed to the bit cell is performed when the write assist signal is inactive.

5. The SRAM device of claim 1, wherein during a write operation the bit line receives a ground voltage and the complementary bit line receives a predetermined voltage.

6. The SRAM device of claim 1, wherein the bit cell comprises:
   a memory cell;
   a third NMOS transistor having a first terminal connected with the bit line, a second terminal connected with the memory cell, and a gate connected with the word line; and
   a fourth NMOS transistor having a first terminal connected with the complementary bit line, a second terminal connected with the memory cell, and a gate connected with the word line.

7. The SRAM device of claim 6, wherein so long as the word line is enabled and a write enable signal is active, the first NMOS transistor is turned ON and the second NMOS transistor is turned OFF, and the internal voltage drops as the internal voltage line discharges.

8. The SRAM device of claim 7, wherein so long as the word line is enabled following discharge of the internal voltage line, the internal voltage rises as the internal voltage line is charged to a level of a power supply voltage when the write enable signal becomes inactive.

9. The SRAM device of claim 1, wherein during a write operation the first NMOS transistor is turned ON and the second NMOS transistor is turned OFF.

10. A static random access memory (SRAM) device comprising:
   a bit cell connected with a word line, connected between a bit line and a complementary bit line, and receiving an internal voltage from a write assist circuit,
   wherein the write assist circuit comprises; a power control circuit that charges/discharges an internal voltage line to provide the internal voltage in response to at least one control signal, and a compensation circuit that controls a level of the internal voltage,
   the at least one control signal includes a power down signal, a write assist signal, and a sleep mode signal, and the power control circuit comprises:
      a NAND gate that receives the write assist signal and the sleep mode signal;
      a first P-type metal oxide semiconductor (PMOS) transistor having a first terminal connected with the internal voltage line, a second terminal connected with a power supply voltage, and a gate receiving an output of the NAND gate;
      a second PMOS transistor having a gate receiving the power down signal and a first terminal connected with the power supply voltage; and
      a third PMOS transistor having a gate and a first terminal connected with the internal voltage line and a second terminal connected with a second terminal of the second PMOS transistor.

11. A method of operating a static random access memory (SRAM) device that includes a bit cell connected with a word line and connected between a bit line and a complementary bit line, the method comprising:
   during a write operation directed to the bit cell, enabling the word line;
   after enabling the word line, decreasing a level of an internal voltage applied to the bit cell using a write assist circuit to decrease the level of the internal voltage from a power supply voltage level to a predetermined level in response at least one control signal; and
   after decreasing the internal voltage, increasing the level of the internal voltage using the write assist circuit to increase the level of the internal voltage from the predetermined level to the power supply voltage level in response to the at least one control signals.

12. The method of claim 11, wherein the at least one control signal includes a write assist signal, and
   when the write assist signal is active and the word line is enabled, the level of the internal voltage decreases, and when the write assist signal is inactive and the word line is enabled, the level of the internal voltage increases.

13. A method of operating a static random access memory (SRAM) device during a write operation, wherein the SRAM comprises a bit cell connected with a word line, connected between a bit line and a complementary bit line, and receives an internal voltage provided by a write assist circuit, the method comprising:
   enabling the word line during a word line enabled window;
   activating a control signal applied to the write assist circuit to decrease a level of the internal voltage, and then inactivating the control signal to increase the level of the internal voltage,
   wherein the control signal includes at least a write assist signal applied to the write assist circuit,
   the decrease of the level of the internal voltage comprises decreasing the level of the internal voltage from a power supply voltage level to a predetermined level, and
   the increase of the level of the internal voltage comprises increasing the level of the internal voltage from the predetermined level to the power supply voltage level.

14. The method of claim 13, wherein the control signal further includes a power down signal and a sleep mode signal, and the method further comprises:
   before the word line enabled window, providing the internal voltage to the bit cell at the power supply voltage level by charging an internal voltage line within the write assist circuit to the power supply level in response to the write assist signal, the power down signal, and the sleep mode signal.

15. The method of claim 14, wherein activating the write enable signal occurs during the word line enabled window.

16. The method of claim 14, wherein deactivating the write enable signal occurs during the word line enabled window.

17. The method of claim 14, wherein activating the write enable signal and inactivating the write enable signal occur during the word line enabled window.

* * * * *